(12) United States Patent
Smith et al.

(10) Patent No.: US 10,854,270 B2
(45) Date of Patent: *Dec. 1, 2020

(54) MEMORY WITH INTERNAL REFRESH RATE CONTROL

(71) Applicant: Micron Technology, Inc., Boise, ID (US)

(72) Inventors: Scott E. Smith, Plano, TX (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/522,240

(22) Filed: Jul. 25, 2019

(65) Prior Publication Data

US 2019/0348102 A1 Nov. 14, 2019

Related U.S. Application Data

(63) Continuation of application No. 15/974,587, filed on May 8, 2018, now Pat. No. 10,497,420.

(51) Int. Cl.
*G11C 11/406* (2006.01)
*G11C 11/408* (2006.01)

(52) U.S. Cl.
CPC ........ *G11C 11/406* (2013.01); *G11C 11/4085* (2013.01); *G11C 11/4087* (2013.01)

(58) Field of Classification Search
CPC .............. G11C 11/406; G11C 11/4085; G11C 11/4087
USPC ....................................................... 365/222
See application file for complete search history.

(56) References Cited

U.S. PATENT DOCUMENTS

| | | | | |
|---|---|---|---|---|
| 5,784,328 | A * | 7/1998 | Irrinki | G11C 7/04 365/149 |
| 6,195,300 | B1 | 2/2001 | Kirihata et al. | |
| 6,778,003 | B1 * | 8/2004 | Callaway | G06F 1/26 327/536 |
| 6,851,017 | B2 * | 2/2005 | Horiguchi | G11C 29/783 365/185.25 |
| 8,908,443 | B1 | 12/2014 | Ellis | |
| 9,805,782 | B1 * | 10/2017 | Liou | G11C 11/403 |
| 9,973,205 | B1 * | 5/2018 | Weber | H03M 7/3086 |
| 2002/0057615 | A1 | 5/2002 | Yahata et al. | |
| 2003/0202413 | A1 * | 10/2003 | Komura | G11C 11/406 365/222 |

(Continued)

*Primary Examiner* — Sung Il Cho
(74) *Attorney, Agent, or Firm* — Perkins Coie LLP

(57) ABSTRACT

Memory devices, systems including memory devices, and methods of operating memory devices in which redundancy match is disabled to permit activating more word lines in parallel during refresh operations to increase a refresh rate of memory cells in a memory array. In one embodiment, a memory device is provided, comprising a memory array including a plurality of word lines arranged in a plurality of memory banks. The memory device further comprises circuitry configured to (i) store a value indicating one or more addresses corresponding to word lines in the plurality of word lines, (ii) disable redundancy match, (iii) activate one or more first word lines in the memory array corresponding to the one or more addresses indicated by the value to refresh first data stored in the memory array, and (iv) update the value based at least in part on activating the one or more first word lines.

25 Claims, 12 Drawing Sheets

(56) References Cited

U.S. PATENT DOCUMENTS

| | | | |
|---|---|---|---|
| 2005/0133852 A1 | 6/2005 | Shau | |
| 2005/0276142 A1* | 12/2005 | Pelley | G11C 11/406 |
| | | | 365/222 |
| 2006/0044898 A1* | 3/2006 | Otsuka | G11C 29/783 |
| | | | 365/200 |
| 2011/0225355 A1* | 9/2011 | Kajigaya | G11C 11/407 |
| | | | 711/106 |
| 2012/0106277 A1* | 5/2012 | Kwean | G11C 11/40622 |
| | | | 365/194 |
| 2014/0029367 A1* | 1/2014 | Jung | G11C 29/50016 |
| | | | 365/222 |
| 2014/0177376 A1* | 6/2014 | Song | G11C 11/4085 |
| | | | 365/230.03 |
| 2016/0026533 A1* | 1/2016 | Ishikawa | G11C 11/406 |
| | | | 714/6.2 |
| 2017/0084353 A1 | 3/2017 | Park et al. | |
| 2017/0194045 A1* | 7/2017 | Kang | G11C 11/4087 |
| 2018/0342284 A1* | 11/2018 | Jin | G11C 11/4087 |
| 2019/0155764 A1* | 5/2019 | Lo | G06F 13/1694 |

* cited by examiner

| Refresh Rate | Pump Option | #WL's Per Bank Per Pump | Redundant After Main |
|---|---|---|---|
| 32ms | 4 | 4 | No |
| 28.4ms | 5/4 | 4 | No |
| 26.9ms | 5/4 | 4 | No |
| 25.6ms | 5 | 4 | No |
| 32ms | 4 | 4 | Yes |
| 28.4ms | 4 | 8 | Yes |
| 25.6ms | 4 | 8 | Yes |
| 23.3ms | 4 | 8 | Yes |
| 21.3ms | 4 | 8 | Yes |
| 18.3ms | 4 | 8 | Yes |
| 16.0ms | 4 | 8 | Yes |
| 8.0ms | 4 | 16 | Yes |
| 32ms | 2 | 8 | Yes |
| 28.4ms | 2 | 16 | Yes |
| 25.6ms | 2 | 16 | Yes |
| 23.3ms | 2 | 16 | Yes |
| 21.3ms | 2 | 16 | Yes |
| 18.3ms | 2 | 16 | Yes |
| 16.0ms | 2 | 16 | Yes |
| 8.0ms | 2 | 32 | Yes |

| Refresh Rate | WL Per Memory Bank | LSB A16 | ← A15 | ← A14 | ← A13 | ← A12 | ← A11 | ← A0 | ← A1 | ← A2 | ← A3 | ← A4 | ← A5 | ← A6 | ← A7 | ← A8 | ← A9 | ← A10 | MSB RPTRow |
|---|---|---|---|---|---|---|---|---|---|---|---|---|---|---|---|---|---|---|---|
| 8ms (431) | 16 | X | X | X | X | X | Pump | Pump | C | C | C | C | C | C | C | C | C | C | C |
| 16ms (432) | 8 | X | X | X | X | Pump | Pump | C | C | C | C | C | C | C | C | C | C | C | C |
| 32ms (433) | 4 | X | X | X | Pump | Pump | C | C | C | C | C | C | C | C | C | C | C | C | C |

Fig. 4B — 435

| Address Bit | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump |
|---|---|---|---|---|---|---|---|---|---|---|---|---|---|---|---|---|
| A13 | X | X | X | X | X | X | X | X | X | X | X | X | X | X | X | X |
| A12 | 0 | 1 | 0 | 1 | 0 | 1 | 0 | 1 | 0 | 1 | 0 | 1 | 0 | 1 | 0 | 1 |
| A11 | 0 | 0 | 1 | 1 | 0 | 0 | 1 | 1 | 0 | 0 | 1 | 1 | 0 | 0 | 1 | 1 |
| A0 | 0 | 0 | 0 | 0 | 1 | 1 | 1 | 1 | 0 | 0 | 0 | 0 | 1 | 1 | 1 | 1 |
| A1 | 0 | 0 | 0 | 0 | 0 | 0 | 0 | 0 | 1 | 1 | 1 | 1 | 1 | 1 | 1 | 1 |
| A2 | 0 | 0 | 0 | 0 | 0 | 0 | 0 | 0 | 0 | 0 | 0 | 0 | 0 | 0 | 0 | 0 |
| A3 | 0 | 0 | 0 | 0 | 0 | 0 | 0 | 0 | 0 | 0 | 0 | 0 | 0 | 0 | 0 | 0 |
| RPTRow | 0 | 0 | 0 | 0 | 0 | 0 | 0 | 0 | 0 | 0 | 0 | 0 | 0 | 0 | 0 | 0 |

Fig. 4C

| Refresh Rate | WL Per Memory Bank | LSB A16 | A15 | A14 | A13 | A12 | A11 | A0 | A1 | A2 | A3 | ... | MSB RPTRow |
|---|---|---|---|---|---|---|---|---|---|---|---|---|---|
| 8ms | 16 | X | X | X | X | X | Pump | Pump | C | C | C | ... | C |
| 16ms | 8 | X | X | X | X | Pump | Pump | Pump | C | C | C | ... | C |
| 32ms | 4 | X | X | X | Pump | Pump | C | C | C | C | C | ... | C |

| Address Bit | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump | 8 WL Pump |
|---|---|---|---|---|---|---|---|---|---|---|---|---|---|
| A13 | X | X | X | X | X | X | X | X | X | X | X | X | X |
| A12 | 0 | 1 | 0 | 1 | 0 | 1 | 0 | 1 | 0 | 1 | 0 | 1 | 0 |
| A11 | 0 | 0 | 1 | 1 | 0 | 0 | 1 | 1 | 0 | 0 | 1 | 1 | 0 |
| A0 | 0 | 0 | 0 | 0 | 1 | 1 | 1 | 1 | 0 | 0 | 0 | 0 | 1 |
| A1 | 0 | 0 | 0 | 0 | 0 | 0 | 0 | 0 | 1 | 1 | 1 | 1 | 1 |
| A2 | 0 | 0 | 0 | 0 | 0 | 0 | 0 | 0 | 0 | 0 | 0 | 0 | 0 |
| A3 | 1 | 1 | 1 | 1 | 1 | 1 | 1 | 1 | 1 | 1 | 1 | 1 | 1 |
| RPTRow | 1 | 0 | 0 | 0 | 0 | 0 | 0 | 0 | 0 | 0 | 0 | 0 | 0 |

445

|  | Pump 1 | Pump 2 | Pump 3 | Pump 4 |
|---|---|---|---|---|
| 551 | 8 WL Per Bank, All Banks | 8 WL Per Bank, Half A Banks | 8 WL Per Bank, Half B Banks | 8 WL Per Bank, All Banks |
| 552 | 8 WL Per Bank, All Banks | 8 WL Per Bank, All Banks | 8 WL Per Bank, All Banks | 0 WL Per Bank, No Banks |
| 553 | 8 WL Per Bank, All Banks | 4 WL Per Bank, All Banks | 4 WL Per Bank, All Banks | 8 WL Per Bank, All Banks |

Fig. 5

| Operation Mode | Refresh Rate | Pump Group 1 | | | | | | | | | Pump Group 2 | | | | | | | | | Pump Group 3 | | | | | | | | | Pump Group 4 | | | | | | | | |
|---|---|---|---|---|---|---|---|---|---|---|---|---|---|---|---|---|---|---|---|---|---|---|---|---|---|---|---|---|---|---|---|---|---|---|---|
| | | Activated WL Per Half Bank | | | | | | | | | Activated WL Per Half Bank | | | | | | | | | Activated WL Per Half Bank | | | | | | | | | Activated WL Per Half Bank | | | | | | | | |
| | | RFSH A | | | | | | | | | RFSH B | | | | | | | | | RFSH C | | | | | | | | | RFSH D | | | | | | | | |
| | | Pump 1 | Pump 2 | Pump 3 | Pump 4 | | | | | | Pump 1 | Pump 2 | Pump 3 | Pump 4 | | | | | | Pump 1 | Pump 2 | Pump 3 | Pump 4 | | | | | | Pump 1 | Pump 2 | Pump 3 | Pump 4 | | | | | |
| 1X | 8ms | 16 | 16 | 16 | 16 | | | | | | 16 | 16 | 16 | 16 | | | | | | 16 | 16 | 16 | 16 | | | | | | 16 | 16 | 16 | 16 | | | | | |
| | 16ms | 8 | 8 | 8 | 8 | | | | | | 8 | 8 | 8 | 8 | | | | | | 8 | 8 | 8 | 8 | | | | | | 8 | 8 | 8 | 8 | | | | | |
| | 17ms | 8 | 8 | 8 | 8 | | | | | | 8 | 8 | 8 | 8 | | | | | | 8 | 8 | 8 | 8 | | | | | | 8 | 8 | 8 | 8 | | | | | |
| | 18.3ms | 8 | 8 | 8 | Skip | | | | | | 8 | 8 | 8 | Skip | | | | | | 8 | 8 | 8 | 8 | | | | | | 8 | 8 | 8 | 8 | | | | | |
| | 19.7ms | 8 | 8 | 8 | Skip | | | | | | 8 | 8 | 8 | Skip | | | | | | 8 | 8 | 8 | Skip | | | | | | 8 | 8 | 8 | Skip | | | | | |
| | 21.3ms | 8 | 8 | 8 | Skip | | | | | | 8 | 8 | Skip | Skip | | | | | | 8 | 8 | 8 | Skip | | | | | | 8 | Skip | 8 | Skip | | | | | |
| | 23.2ms | 8 | 8 | Skip | Skip | | | | | | 8 | 8 | Skip | Skip | | | | | | 8 | Skip | 8 | Skip | | | | | | 8 | Skip | 8 | Skip | | | | | |
| | 25.6ms | 8 | 8 | Skip | Skip | | | | | | 8 | 8 | Skip | Skip | | | | | | 8 | Skip | 8 | Skip | | | | | | 8 | Skip | 8 | Skip | | | | | |
| | 28.4ms | 8 | 8 | Skip | Skip | | | | | | 8 | 8 | Skip | Skip | | | | | | 8 | Skip | 8 | Skip | | | | | | 8 | Skip | 8 | Skip | | | | | |
| | 32ms | 4 | 4 | 4 | 4 | | | | | | 4 | 4 | 4 | 4 | | | | | | 4 | 4 | 4 | 4 | | | | | | 4 | 4 | 4 | 4 | | | | | |
| | | RFSH A1 | | | | RFSH A2 | | | | | RFSH B1 | | | | RFSH B2 | | | | | RFSH C1 | | | | RFSH C2 | | | | | RFSH D1 | | | | RFSH D2 | | | | |
| | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 |
| 2X | 8ms | 16 | 16 | 16 | 16 | 16 | 16 | 16 | 16 | | 16 | 16 | 16 | 16 | 16 | 16 | 16 | 16 | | 16 | 16 | 16 | 16 | 16 | 16 | 16 | 16 | | 16 | 16 | 16 | 16 | 16 | 16 | 16 | 16 |
| | 16ms | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 |
| | 17ms | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 |
| | 18.3ms | 8 | 8 | 8 | Skip | 8 | 8 | 8 | Skip | | 8 | 8 | 8 | Skip | 8 | 8 | 8 | Skip | | 8 | 8 | 8 | 8 | 8 | 8 | 8 | 8 | | 8 | 8 | 8 | 8 | 8 | 8 | 8 | 8 |
| | 19.7ms | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip |
| | 21.3ms | 8 | 8 | 8 | Skip | 8 | 8 | 8 | Skip | | 8 | 8 | Skip | Skip | 8 | 8 | Skip | Skip | | 8 | 8 | 8 | Skip | 8 | 8 | 8 | Skip | | 8 | Skip | 8 | Skip | 8 | Skip | 8 | Skip |
| | 23.2ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 25.6ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 28.4ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 32ms | 4 | 4 | 4 | 4 | 4 | 4 | 4 | 4 | | 4 | 4 | 4 | 4 | 4 | 4 | 4 | 4 | | 4 | 4 | 4 | 4 | 4 | 4 | 4 | 4 | | 4 | 4 | 4 | 4 | 4 | 4 | 4 | 4 |
| | | RFSH A1 | | | | RFSH A2 | RFSH A3 | | | RFSH A4 | RFSH B1 | | | | RFSH B2 | RFSH B3 | | | RFSH B4 | RFSH C1 | | | | RFSH C2 | RFSH C3 | | | RFSH C4 | RFSH D1 | | | | RFSH D2 | RFSH D3 | | | RFSH D4 |
| | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 | | Pump 1 | Pump 2 | Pump 3 | Pump 4 | Pump 1 | Pump 2 | Pump 3 | Pump 4 |
| 4X | 8ms | 16 | 16 | 16 | 16 | 16 | 16 | 16 | 16 | | 16 | 16 | 16 | 16 | 16 | 16 | 16 | 16 | | 16 | 16 | 16 | 16 | 16 | 16 | 16 | 16 | | 16 | 16 | 16 | 16 | 16 | 16 | 16 | 16 |
| | 16ms | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 |
| | 17ms | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 | | 8 | 8 | 8 | 8 | 8 | 8 | 8 | 8 |
| | 18.3ms | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip |
| | 19.7ms | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip | | 8 | 8 | 8 | Skip | 8 | 8 | 8 | Skip |
| | 21.3ms | 8 | 8 | 8 | Skip | 8 | 8 | 8 | Skip | | 8 | 8 | Skip | Skip | 8 | 8 | Skip | Skip | | 8 | 8 | 8 | Skip | 8 | 8 | 8 | Skip | | 8 | Skip | 8 | Skip | 8 | Skip | 8 | Skip |
| | 23.2ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 25.6ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 28.4ms | 8 | 8 | Skip | Skip | 8 | 8 | Skip | Skip | | 8 | 8 | Skip | Skip | 8 | 8 | Skip | Skip | | 8 | Skip | 8 | Skip | 8 | Skip | 8 | Skip | | 8 | Skip | 8 | Skip | 8 | Skip | 8 | Skip |
| | 32ms | 4 | 4 | 4 | 4 | 4 | 4 | 4 | 4 | | 4 | 4 | 4 | 4 | 4 | 4 | 4 | 4 | | 4 | 4 | 4 | 4 | 4 | 4 | 4 | 4 | | 4 | 4 | 4 | 4 | 4 | 4 | 4 | 4 |

MEMORY WITH INTERNAL REFRESH RATE CONTROL

CROSS-REFERENCE TO RELATED APPLICATIONS

This application is a continuation of U.S. application Ser. No. 15/974,587, filed May 8, 2018, which is incorporated herein by reference in its entirety.

TECHNICAL FIELD

The present disclosure is related to memory systems, devices, and associated methods. In particular, the present disclosure is related to memory devices with internal refresh rate control.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

FIG. 3A is a table illustrating various refresh rates in accordance with embodiments of the present technology.

FIG. 4A is a table illustrating four pump counting sequences for a CBR counter, and FIG. 4B is a table illustrating a portion of a four pump, eight word line activation counting sequence illustrated in FIG. 4A.

FIG. 4C is a table illustrating truncated four pump counting sequences of a redundancy array, and FIG. 4D is a table illustrating a portion of the four pump, eight word line activation counting sequence illustrated in FIGS. 4A-4C.

FIG. 5 is a table illustrating various dry fires or skips of eight word line activation pumps in pump groups.

FIGS. 6A and 6B are tables illustrating pump sequences on an 8 GB memory device in accordance with a four pump counting sequence and a two pump counting sequence, respectively.

DETAILED DESCRIPTION

Figure 1:
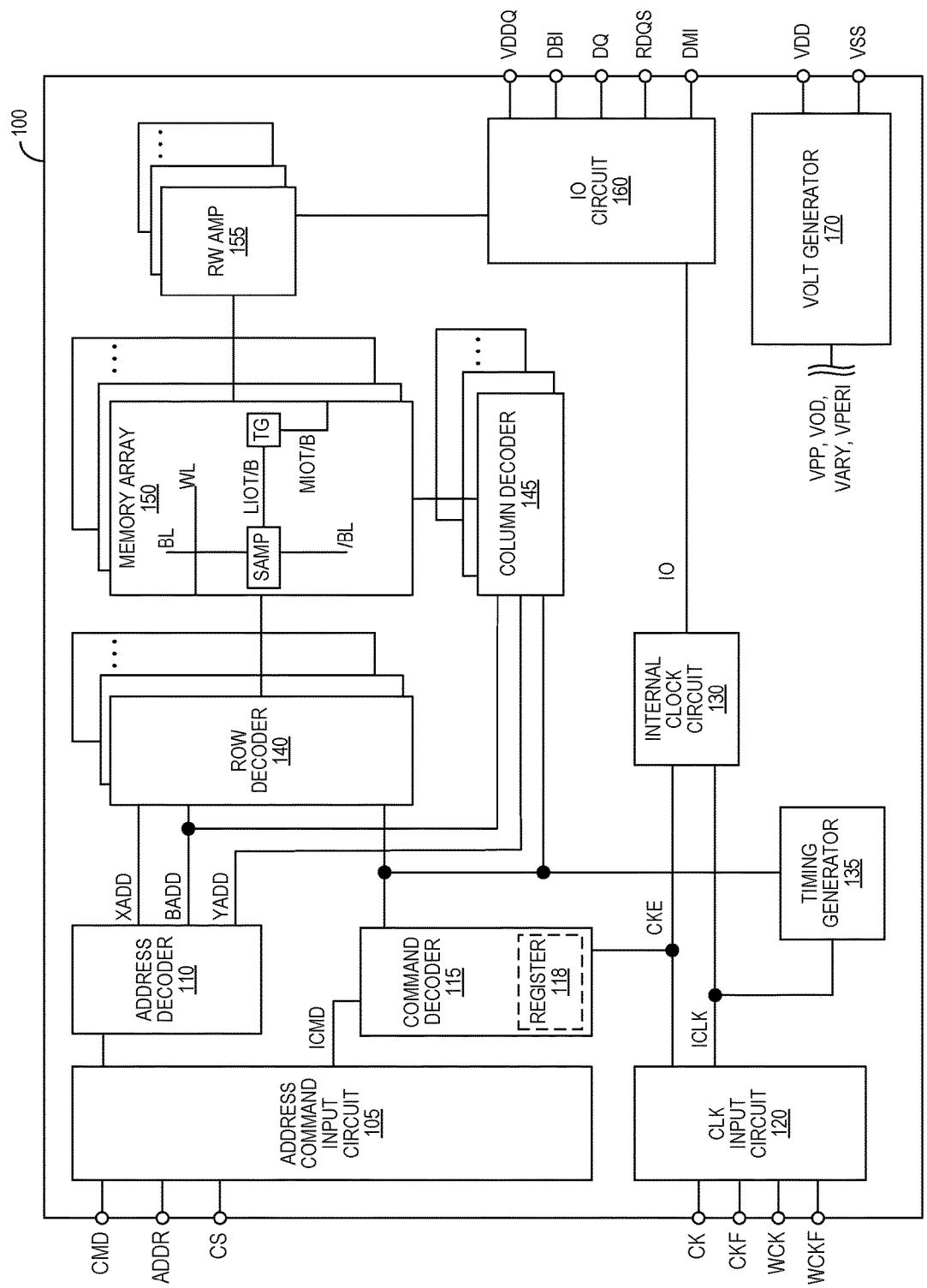
FIG. 1 is a block diagram schematically illustrating a memory device configured in accordance with an embodiment of the present technology.

As discussed in greater detail below, the technology disclosed herein relates to memory systems and devices with internal refresh rate control over memory cells in a memory array of the memory systems and devices. A person skilled in the art, however, will understand that the technology may have additional embodiments and that the technology may be practiced without several of the details of the embodiments described below with reference to FIGS. 1-8. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

The memory cells in a memory array of a memory device may be periodically refreshed to prevent data loss. For example, volatile memory devices, such as DRAM devices, may periodically refresh memory cells (e.g., by restoring charge levels on the memory cells) to prevent data loss due to charge leakage. Refreshing the memory cells, however, often consumes a large amount of processing time and power of the memory device.

One approach to decreasing the amount of processing time consumed by a refresh operation of the memory device is activating more than one word line in parallel by compressing word line addresses into a single pump. This approach is limited by the redundancy architecture of the memory device because attempting to access too many word lines in parallel creates redundancy match conflicts within a redundancy match circuit of the memory device. The redundancy match conflict prevents the memory device from firing word lines from more than one independent word line group. Thus, the number of the word lines that can be activated in parallel is limited in conventional memory devices by the number of times a repair is repeated across the memory array.

Another approach to decreasing the amount of processing time consumed by refresh operations is firing more than one pump in response to each refresh command received from a host device or memory controller. Each word line in each pump, however, must remain activated for a certain amount of time to refresh the corresponding memory cells. A timing specification tRFC defines a maximum amount of time allotted to the memory device to fire each pump and/or each sequence of pumps before the memory device can receive another command (e.g., another refresh command). As such, the number of pumps fired in response to each refresh command must fit within and is limited by the timing specification tRFC.

To overcome these limitations and to further reduce processing time consumed by refresh operations, several embodiments of the present technology are directed to memory devices, systems including memory devices, and methods of operating memory devices in which redundancy match is disabled during a refresh operation. Thus, the number of word lines that can be activated in parallel is no longer constrained by the redundancy architecture of the memory array. In one embodiment, a CBR counter increments through, compresses, and/or pumps addresses of word lines in the memory array. In some embodiments, the memory device disables the row address decoder to the main array before and/or after the memory device accesses and activates all of the main word lines in the memory array such that the memory device can access and activate redundant word lines in the memory array separately from main word lines in the memory array. To conserve power and/or to throttle back the refresh rate of the memory cells in the memory array, the memory device in some embodiments can dry fire or skip pumps in a pump sequence. In this manner, the memory device can achieve faster refresh rates than previously possible under conventional refresh schemes while still adhering to the timing specification tRFC.

FIG. 1 is a block diagram schematically illustrating a memory device 100 configured in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, VDDQ, and VSSQ.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK. The command decoder 115 may further include one or more registers 118 for tracking various counts or values (e.g., counts of refresh commands received by the memory device 100 or self-refresh operations performed by the memory device 100).

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (TO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

The memory array 150 may be refreshed or maintained as described herein to prevent data loss, either due to charge leakage or imprint effects. A refresh operation, as described herein, may be initiated by a host device or memory controller, for example, and may include accessing one or more rows (e.g., WL) and discharging cells of the accessed row to a corresponding SAMP. While the row is opened (i.e., while the accessed WL is energized), the SAMP may compare the voltage resulting from the discharged cell to a reference. The SAMP may then write back a logic value (i.e., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 further includes circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh every memory cell in the memory array 150 within a given refresh rate or time window (e.g., 32 ms, 28 ms, 25 ms, 23 ms, 21 ms, 18 ms, 16 ms, 8 ms, etc.). In these embodiments, a host device or a memory controller operably connected to the memory device 100 can be configured to supply refresh commands to the memory device 100 in accordance with a specified minimum cadence. For example, the host device or the memory controller can be configured to supply one or more refresh commands to the memory device 100 at least every 7.8 μs such that an approximate minimum of 4000 refresh commands are supplied to the memory device 100 within a 32 ms time window. The memory array 150, however, can contain more than 4000 word lines (e.g., 8000 word lines and 64 redundant word lines). Thus, firing one word line for each received refresh command would not refresh every word line in the memory array 150 within the 32 ms allotted. Therefore, two or more word line addresses in each memory bank of the memory array 150 are compressed into pumps such that more than one word line per memory bank can be activated and refreshed in parallel at a time. For example, four word line addresses can be compressed into a pump such that the four word line addresses per memory bank are activated and refreshed in parallel when the pump is fired. In other embodiments, a different number (e.g., two, five, eight, sixteen, thirty-two) of word line addresses can be compressed into a pump, as described in greater detail below.

In these and other embodiments, the memory device 100 can be configured to fire one or more pumps for each refresh command received. In 1× mode, for example, the memory device 100 can be configured to fire four pumps for each refresh command received. In 2× mode and 4× mode, the memory device 100 can be configured to fire two pumps or one pump, respectively, for each refresh command received from the host device or the memory controller. Thus, by using word line address compression and/or by firing more than one pump per refresh command, the memory device 100 can successfully refresh every memory cell in the memory array 150 within a desired refresh rate.

Figure 2:
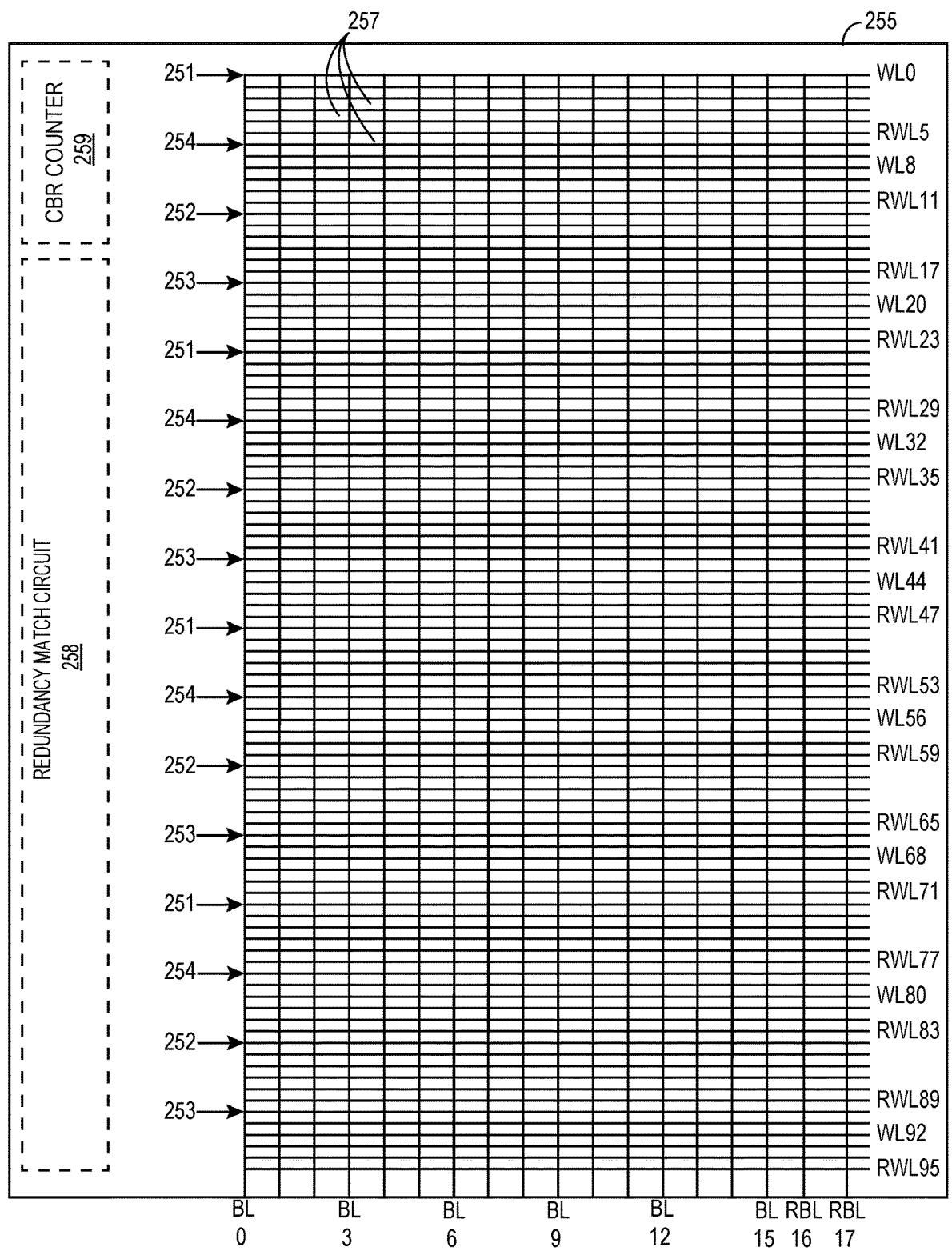
FIG. 2 is a block diagram schematically illustrating a memory bank in a memory array of the memory device illustrated in FIG. 1.

FIG. 2 is a diagram schematically illustrating a memory bank 255 in the memory array 150 having a plurality of word lines WL0-WL95, a plurality of bit lines BL0-BL17, and memory cells 257 at intersections of the word lines WL0-WL95 and bit lines BL0-BL17. The memory bank 255 and/or the memory array 150 further includes a CBD counter 259 to track activated word lines WL in the memory array 150. As shown, the plurality of word lines WL0-WL95 includes redundant word lines RWL5, RWL11, RWL17, RWL23, RWL29, RWL35, RWL41, RWL47, RWL53, RWL59, RWL65, RWL71, RWL77, RWL83, RWL89, and RWL95. Word lines in the plurality of word lines WL0-WL95 that are not redundant word lines are referred to hereinafter as main word lines. The main word lines are word limes that are fired in response to an externally provided address and that do not generate a redundant match in the redundancy match circuit, as described below. The plurality of bit lines BL0-BL17 similarly includes main bit lines BL0-BL15 and redundant bit lines RBL16 and RBL17.

The redundant word lines RWL and the redundant bit lines RBL16 and RBL17 are used to replace/repair defective memory cells 257 (e.g., defective main word lines and/or defective main bit lines) in the memory bank 255 and are governed by a redundancy match circuit 258 on the memory bank 255 and/or on the memory array 150. For example, if a memory cell connected to main word line WL2 and main bit line BL1 of the memory bank 255 is defective, the memory device (e.g., the memory device 100; FIG. 1) can blow a fuse (not shown) connected to main word line WL2 to physically steer the address of main word line WL2 to redundant word line RWL5 or RWL11. As a result, when a host device or a memory controller references the address of the defective memory cell 257, the address is physically redirected to the memory cell 257 at the intersection of word line RWL88 and main bit line BL1.

As discussed in greater detail below, multiple address bits in native addresses of the word lines can be compressed during a refresh operation. When the redundancy match circuit is enabled, this can cause the redundancy match circuit to match a provided native address (e.g., the native address corresponding to defective main word line WL2) with multiple addresses in the array during the refresh operation. Therefore, in some memory devices, a repair is repeated across multiple redundant word lines corresponding to the multiple addresses matched by the redundancy match circuit. As such, in these memory devices, the multiple redundant word lines are referenced when a host device or a memory controller references the native address of a defective word line (e.g., the defective main word line WL2).

Although the memory bank 255 is illustrated with 96 word lines and 18 bit lines, memory banks 255 configured in accordance with other embodiments of the present technology can have greater or fewer word lines, bit lines, and/or memory cells 257. Similarly, the memory bank 255 can include a different number of redundant word lines, a different number of redundant bit lines, and/or a different arrangement of redundant word lines and/or redundant bit lines (e.g., all redundant word lines at the beginning of the memory bank 255, all redundant bit lines at the beginning of the memory bank 255, a redundant word line as every fourth word line, one or more redundant word lines and/or redundant bit lines on a different memory bank 255 in the memory array 150, etc.). In these and other embodiments, a memory bank can include multiple sections (e.g., 80 sections) of one or more word lines, and redundant word lines RWL can be distributed across the memory bank such that there are redundant word lines at the end of every five sections in the memory bank.

All of the memory cells 257 of the memory bank 255 can be refreshed during a refresh operation, as discussed above. For example, all of the memory cells 257 in the memory array 150 (including in the memory bank 255) can be refreshed within a 32 ms refresh rate time window. To achieve this, the addresses of four word lines per memory bank 255 in the memory array 150 can be compressed into a pump such that the four word lines on each memory bank 255 are activated in parallel when the pump is fired. In FIG. 2, four pumps are shown indicated by arrows 251, 252, 253, and 254. When pump 251 is fired, word lines WL0, WL12, WL24, and WL36 of the memory bank 255 are activated in parallel such that memory cells 257 in these rows are refreshed. Each time the memory device 100 fires a pump, a value stored in the CBR counter 259 on the memory bank 255 and/or on the memory array 150 is updated/incremented (e.g., to indicate the most recently fired pump and/or word line address, or to indicate a next-to-be fired pump and/or word line addresses). For example, after the pump 251 is fired, a value stored on the CBR counter 259 can be incremented to indicate that the pump 251 and/or the word line addresses in the pump 251 were fired or to indicate that the pump 252 and/or the word line addresses in the pump 252 are the next-to-be-updated pump and/or word line addresses. After the memory device 100 fires the pump 252, the value stored on the CBR counter 259 can again be incremented, and the memory device 100 can fire the next pump in the sequence.

In some embodiments, the memory device 100 can be configured to fire more than one pump in response to receiving a refresh command from a host device or a memory controller. For example, when the memory device 100 is operated in 1× mode, the memory device 100 can fire the pumps 251-254 sequentially in response to receiving a single refresh command from a host device or a memory controller. In 2× ode, the memory device 100 (1) can fire pumps 251 and 252 when the memory device 100 receives a first refresh command and (2) can fire pumps 253 and 254 when the memory device 100 receives a second refresh command. In 4× mode, the memory device 100 fires a single pump in response to each refresh command it receives from the host device or the memory controller.

In some embodiments, the memory device 100 can achieve faster refresh rates by increasing the number of pumps it fires in response to each refresh command. For example, the memory device 100 can fire five pumps of four word line addresses to refresh all of the memory cells 257 in the memory array 150 within approximately 25 ms (e.g., 25.6 ms). In these embodiments, the memory device 100 fires five pumps in response to each refresh command it receives from the host device or the memory controller. In other embodiments, the memory device 100 can fire five pumps in combination with (e.g., every two, three, four, etc. pumps) firing four pumps per refresh command to achieve refresh rates between 25 ms and 32 ms (e.g., 26 ms, 26.9 ms, 27 ms, 28 ms, 28.4 ms, etc.).

The number of pumps that can be fired in response to each refresh command is constrained by peak power and a timing specification tRFC of the memory device 100. The timing specification tRFC defines a maximum amount of time the memory device 100 can take to fire one or more pumps before a new command can be given to the memory device 100. Each word line in a pump must be activated for a time t1 that is long enough to refresh a memory cells 257 in the word line. Thus, the time t1 multiplied by the number of pumps fired in response to a refresh command must fit within the time specification tRFC. In some embodiments, where the timing specification tRFC is 350 ns, the maximum number of pumps that can be fired in response to a single refresh command is five such that firing six pumps violates the timing specification tRFC.

To further reduce the refresh rate while adhering to the timing specification tRFC, a memory device can activate more than four word lines in parallel per memory bank 255 per pump. In conventional memory devices, however, the number of the activated word lines in each pump is constrained by the peak power and by the word line redundancy architecture of the memory device. For example, in a memory device configured to replace/repair four word lines at a time with a redundant word line group by compressing two address terms in a redundancy match circuit of the memory device, the maximum number of word lines that can be activated per pump is four. Activating more than four word lines per pump can create a redundancy match conflict when the memory device refreshes redundant word lines because the memory device attempts to access redundant word lines from at least two independent redundant word line groups. The conflict prevents the memory device 100 from firing a corresponding pump.

In contrast with these memory devices, memory devices configured in accordance with the present technology (e.g., the memory device 100) are configured to disable redundant match detection in the redundancy match circuit 258 during refresh operations. In this manner, the memory device 100 views the memory array 150 as one large continuous memory array including both main word line and redundant word lines. As described in greater detail below, the counting sequence of the CBR counter 259 logically breaks the memory array 150 into a main array including the main word lines and a redundant array including the redundant word lines. In these embodiments, the memory device 100 is configured to refresh all of the main word lines in the main array before or after refreshing all of the redundant word lines in the redundant array. In this manner, the memory device 100 can compress a greater number (e.g., eight, sixteen, thirty-two, etc.) of word line addresses per memory bank 255 per pump without creating a redundancy match conflict. Thus, the number of word lines that can be activated in parallel is constrained only by the peak power of the memory device 100. This permits the memory device 100 to increase the refresh rate of the word lines in the memory array 150 while firing the same (e.g., five and/or four) and/or a lesser number (e.g., three, two, and/or one) of pumps in response to each refresh command and while adhering to the timing specification tRFC discussed above.

In some embodiments, the memory device 100 can be configured to change one or more timing specifications, such as tRAS and/or tRP depending upon the number of word lines activated per pump and/or in accordance with how much time a particular refresh operation requires to complete. The timing specification tRAS refers to a period of time that a word line is activated and that the memory device 100 has to re-write data to corresponding memory cells. The timing specifications tRP refers to a period of time required to precharge a word line while it is deactivated and is being prepared for sensing by the sense amplifiers (FIG. 1) of the memory device 100. In some embodiments, the memory device 100 can be configured to minimize the timing specification tRP. For example, when the memory device 100 fires two or more pumps in sequence, the memory device 100 in some embodiments can be configured to refresh word lines in first section(s) of the memory banks in a first pump and to refresh word lines in second section(s) of the memory banks different than the first section(s) in a second pump. This allows the word lines in the second section(s) to precharge the entire time the word lines in the first section(s) are activated and refreshed when the first pump is fired. Because the word lines in the second section(s) are precharged in parallel with firing the first pump, the timing specification tRP can be minimized.

FIG. 3A is a table 310 illustrating various refresh rates in accordance with embodiments of the present technology. In some embodiments, a desired refresh rate can be selected from the table 310 by blowing fuses in and/or hardwiring the memory array 150. For example, a desired refresh rate can be selected during manufacture and/or testing of the memory device 100 and/or by an end-user of the memory device 100.

As shown in section 311 of the table 310, the memory device 100 can achieve 32 ms, 28.4 ms, 26.9 ms, and 25.6 ms refresh rates in accordance with the conventional refresh operation schemes discussed above (i.e., by firing, in response to each refresh command, four and/or five pumps of four parallel word line activations per memory bank 255). Sections 312 and 313 of the table 310 show that the memory device 100 can achieve similar refresh rates after disabling redundancy match in the redundancy match circuit 258 of the memory device 100. More specifically, the memory device 100 can achieve similar refresh rates by firing, in response to each refresh command, two or four pumps of four, eight, or sixteen parallel word line activations per memory bank 255.

Figure 3B:
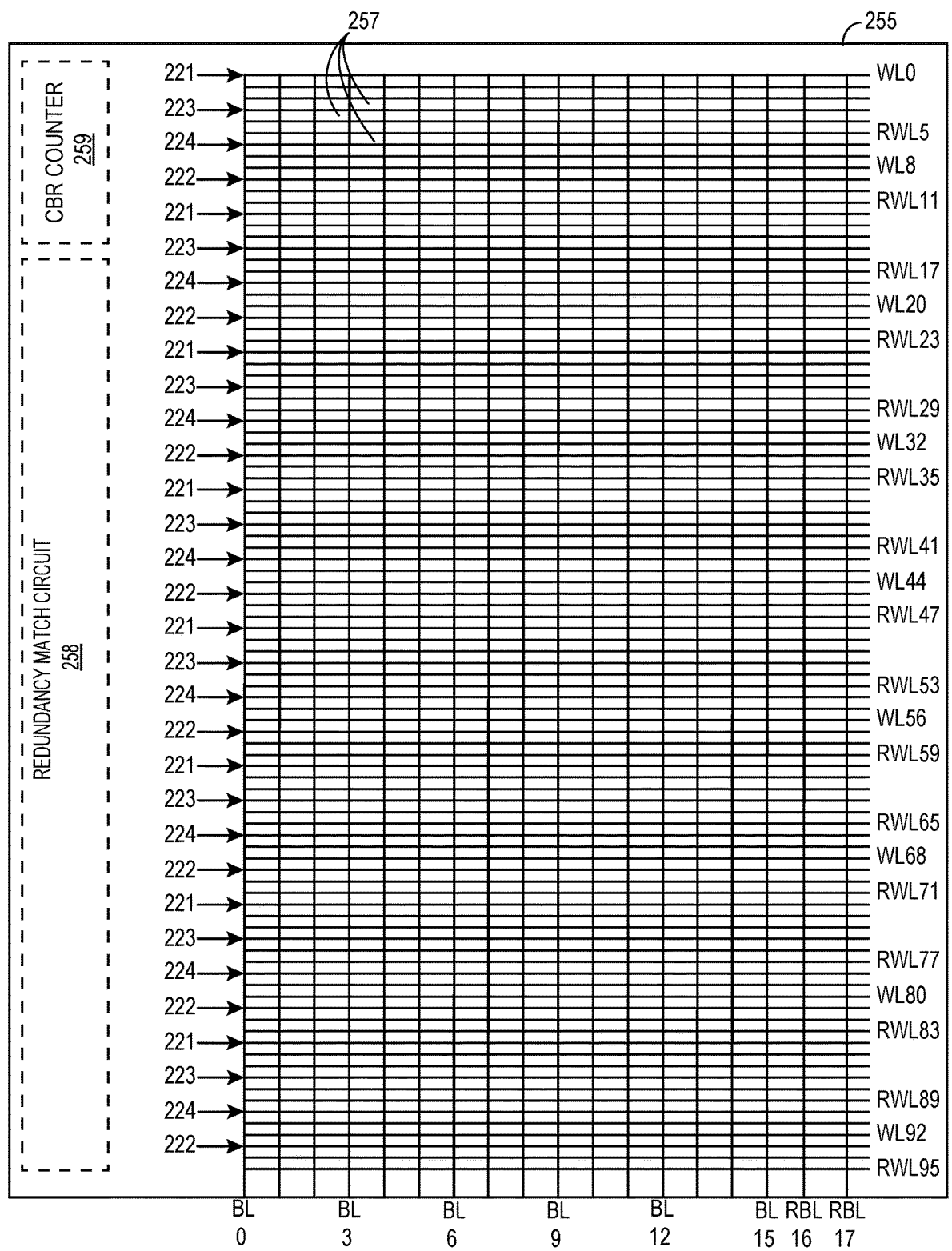
FIGS. 3B and 3C illustrate four pump and two pump refresh operation options, respectively, on the memory bank shown in FIG. 2.
Figure 3C:
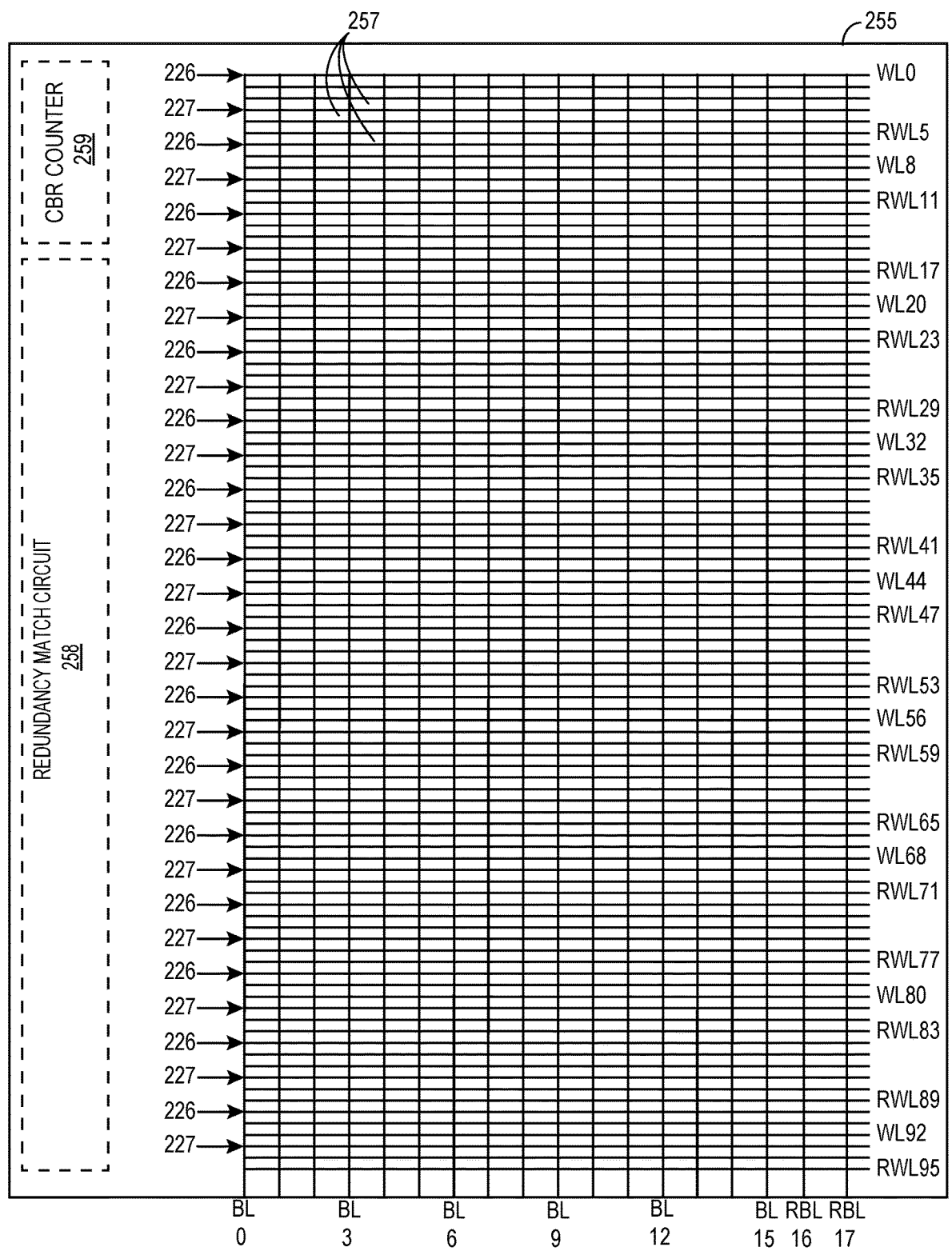

Sections 312 and 313 of the table 310 also show that the memory device 100 can achieve faster refresh rates than previously possible under the conventional refresh operation schemes. For example, FIGS. 3B and 3C illustrate the memory bank 255 of FIG. 2 under four pump and two pump refresh operation options, respectively. As illustrated in FIG. 3B, the memory device 100 can be configured to fire four pumps (e.g., pumps 221-224), with each of the pumps 221-224 activating eight word lines per memory bank 255 in parallel. After the memory device 100 fires a pump (e.g., the pump 221), the memory device 100 can update the CBR counter 259 and can fire the next pump (e.g., the pump 222) in response to the same or a next received refresh command. When (i) the CBR counter 259 reaches the last pump and/or word line addresses in the memory array 150 and (ii) both the main and redundant word lines have been refreshed, the CBR counter is reset and the memory device 100 can continue from the first pump in the memory array 150. As shown in FIG. 3C, the memory device 100 can achieve the same refresh rate of 16 ms by firing two pumps (e.g., pumps 226 and 227) of sixteen parallel word line activations per memory bank 255 (as shown in FIG. 3C).

FIG. 4A is a table 430 illustrating four-pump counting sequences 431-433 for the CBR counter 259. More specifically, the counting sequences 431-433 correspond to activating 16, 8, or 4 word lines, respectively, in parallel per memory bank 255 per pump to achieve 8 ms, 16 ms, and 32 ms refresh rates, respectively. As shown, every word line in the memory array 150 can be referenced by an 18 bit value or address. The address bits are arranged in order of least significant bit to most significant bit in the table 430. As shown, address bits 16, 15, and 14 are compressed for each word line activation (indicated by "X"), meaning that the memory device 100 does not care whether the address bits 16, 15, or 14 are in state "0" or are in state "1." In other words, the memory device 100 can access word lines in both state "0" and state "1" of the address bits 16, 15, and 14 at the same time. By compressing additional address bits, more word lines in the memory array 150 can be activated per pump. For example, compressing address bit 13 in addition to address bits 16, 15, and 14 allows eight word lines to be activated per memory bank 255 per pump, and compressing address bit 12 in addition to address bits 16, 15, 14, and 13 allows 16 word lines to be activated per memory bank 255 per pump.

FIG. 4B is a table 435 illustrating a portion of the four-pump, eight word line activation counting sequence 432 shown in FIG. 4A. Referring to FIGS. 4A and 4B together and to the counting sequence 432 as an example, the CBR counter 259 will count address bits 12, 11, 0, 1, 2, 3, 4, 5, 6, 7, 8, 9, and 10 (indicated by "C" in the table 430) while address bits 16, 15, 14, and 13 are compressed (indicated by "X" in the table 430). The memory device 100 is configured to fire a pump for each state of address bits 12 and 11 (indicated by "Pump" in the table 430). In other words, the memory device 100 fires four pumps (one pump for each state combination—"00," "01," "10," and "11"—of address bits 12 and 11) as address bits 12 and 11 are incremented in the CBR counter 259. Because address bits 16, 15, 14, and 13 are compressed, each pump activates eight word lines in parallel per memory bank 255.

Two-pump counting sequences (not shown) of the present technology differ from the four-pump counting sequences 431-433 illustrated in FIG. 4A in that the memory device 100 is configured to fire a pump for each state (i.e., "0" and "1") of only a single address bit. For example, the equivalent two-pump, 16 ms refresh rate counting sequence to the four-pump, 16 ms refresh rate counting sequence 432 in FIG. 4A (1) fires one pump for each state of only address bit 11 and (2) compresses address bits 16, 15, 14, 13, and 12. Thus, the two-pump, 16 ms refresh rate counting sequence activates 16 word lines in parallel per memory bank per pump (i.e., twice as many as the four-pump, 16 ms counting sequence 432) with half as many total pumps.

Referring again to FIG. 4A, the most significant address bit of the CBR counter 259 is a redundancy pretest address bit RPTRow. In some memory devices, redundancy pretest is a test mode that allows access to redundant word lines within the memory array 150. When the memory devices are in redundancy pretest, the row address decoder to the main array of word lines in the memory array 150 is disabled such that only redundant word lines can fire. By implementing the redundant pretest signal as the most significant address bit in the CBR counter 259, the main word lines in the memory array 150 are logically separated from the redundant word lines in the memory array 150 such that the memory device 100 can access and activate redundant word lines in a redundancy array of the memory array 150 separate from (e.g., before or after) accessing the main word lines in a main array of the memory array 150. In the illustrated embodiment, when address RPTRow is low, the memory device 100 can activate main word lines in the main array. When the address RPTRow is high, the memory device 100 can activate redundant word lines in the redundancy array. Thus, the redundant word lines in this embodiment are refreshed after all of the main word lines in the memory array 150 are refreshed.

FIG. 4C is a table 440 illustrating the counting sequences 431-433 illustrated in the table 430 in FIG. 4A but truncated to illustrate only the redundancy array of the memory array 150. The table 440 is truncated because every redundant word line in the memory array can be referenced by addresses bits 16, 15, 14, 13, 12, 11, 0, 1, 2, 3, and RPTRow as there are fewer redundant word lines than main word lines in the memory array 150. Thus, address bits 4, 5, 6, 7, 8, 9, and 10 all remain in the same state (e.g., a low or "0" state) and are not illustrated in the table 450.

FIG. 4D is a table 445 illustrating a portion of the four-pump, eight word line activation counting sequence 432 corresponding only to the redundancy array. In contrast with the table 435 illustrated in FIG. 4B, the table 445 in FIG. 4D shows the RPTRow bit address in state "1" rather than in state "0," which indicates that the CBR counter 259 is counting through the redundant word lines in the redundant array of the memory array 150. Referring to FIGS. 4C and 4D together, as the CBR counter 259 counts through the redundant array, the same address bits (i.e., address bits 16, 15, 14, and 13) remain compressed (indicated by an "X" in the table 440), and the memory device 100 still fires a pump for every state combination of address bits 12 and 11 (indicated by "Pump" in the table 440). After the CBR counter 259 is incremented to the last address of the last redundant word line in the redundancy array, the CBR counter 259 can be reset (e.g., to an all "0" state) to indicate the first address of a word line in the main array of the memory array 150. The memory device 100 can then proceed to refresh memory cells 257 in the main array in accordance with the discussion above.

In some embodiments, the memory device 100 refreshes every word line in the memory array 150 (both in the main array and in the redundant array) regardless of whether the word line is defective and/or has been repaired with a redundant word line or a redundant bit line. In these and other embodiments, the memory device 100 refreshes every redundant word line in the redundancy array as the CBR counter 259 counts through the refresh array regardless of whether the redundant word line has been used to repair a defective word line. In other embodiments, the memory device 100 refrains from refreshing word lines that have been repaired by redundant word lines and/or redundant bit lines, or have otherwise been flagged as defective. In these and still other embodiments, the memory device 100 may refrain from refreshing word lines (e.g., redundant word lines) that have not been used.

By separating the main array refresh from the redundant array refresh and disabling redundancy match during refresh operations, the memory device 100 avoids the redundancy match conflicts discussed above. Thus, the memory device 100 can compress a greater number of address bits to activate a greater number of word lines in parallel per memory bank 255 per pump. In addition, the redundancy architecture of the memory array 150 is no longer restricted because there is no longer a redundancy match concern. As a result, each redundant word line address can remain uncompressed during other operations (e.g., reading, writing, etc.) of the memory device 100. In turn, the memory device 100 can repair any defective word line with any redundant word line in the memory array 150 because the repair is no longer repeated across multiple redundant word lines and is no longer restricted to a specific address region in the memory array 150. Therefore, a greater number of defective word lines across the memory array 150 can be repaired than under conventional refresh and/or addressing schemes, which increases the performance and life of the memory device 100.

Referring again to FIG. 3A and as shown in the sections 312 and 313 of the table 310, the memory device 100 can achieve other refresh rates between 16 ms and 28.4 ms without changing the number of word lines activated in parallel per memory bank 255 per pump and without changing the mode of operation (e.g., 1×, 2×, 4×etc.) of the memory device 100. In some embodiments, the memory device 100 achieves these other refresh rates by dry firing (e.g., dry activating, blank activating, skipping, etc.) one or more pumps in a predetermined sequence. A dry fire or skip of a pump occurs when the memory device 100 does not activate all or a portion of word lines in a pump. When a dry fire or skip occurs, the CBR counter 259 is not incremented or is only partially incremented such that the word lines not activated in the skipped pump are activated in a future pump (e.g., the next fired pump). In some embodiments, skipping pumps can be used to conserve power and/or to allow the memory device 100 to receive external commands and/or to perform other operations.

FIG. 5 is a table 550 illustrating various dry fires or skips of eight word line activation pumps in three pump groups 551, 552, and 553. In some embodiments, the memory device 100 can be configured to activate only half of the memory banks 255 in the memory array 150 on two pumps (e.g., pumps 2 and 3) in a pump group (as shown in the pump group 551). In these and other embodiments, the memory device 100 can be configured to activate word lines of only three pumps in a pump group by not activating any word lines in one of the pumps (e.g., pump 4) of the pump group (as shown in the pump group 552). In these and still other embodiments, the memory device 100 can be configured to activate only half of the word lines per memory bank 255 in two pumps (e.g., pumps 2 and 3) in a pump group (as shown in the pump group 553). In each of these illustrated pump groups 551-553, the same total number of word lines per pump group are activated to achieve a 18 ms refresh rate.

Figure 6B:
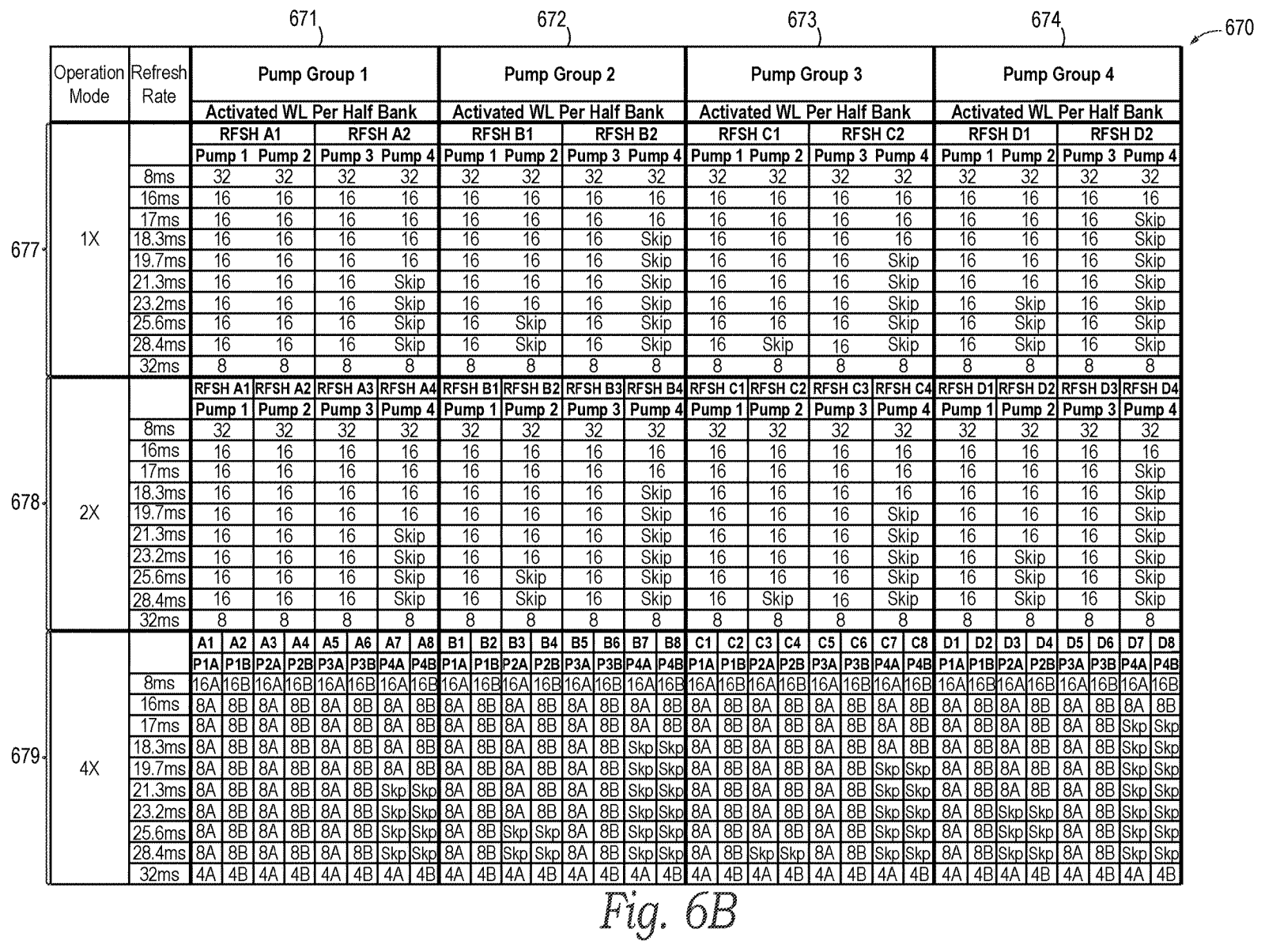

FIGS. 6A and 6B are tables 660 and 670 illustrating pump sequences on an 8 GB memory device 100 in accordance with a four-pump counting sequence and a two-pump counting sequence, respectively. In some embodiments, all or a portion of the table 660 and/or the table 670 can be stored in (e.g., an embedded memory of) the memory device 100. In these and other embodiments, the memory device 100 can include an engine, such as a refresh state machine (not shown). Inputs to the refresh state machine can include one or more fuse options to select a refresh rate from the table 660 and/or the table 670. In operation, the refresh state machine can be configured to (i) store all or a portion of the table 660 and/or the table 670 and/or (ii) track a current location in a sequence corresponding to the selected refresh rate, as described in greater detail below.

Referring to FIG. 6A, the table 660 includes sections 667, 668, and 669 illustrating a sequence of four pump groups 661-664. The sections 667-669 correspond to the memory device 100 operating in a 1×, 2×, and 4× mode, respectively. As shown in the section 667, the memory device 100 can achieve one of several refresh rates by activating a certain number of word lines in parallel per half bank per pump and/or by skipping one or more pumps in a pump sequence. For example, the memory device 100 can achieve 16 ms refresh rate by activating 8 word lines in parallel per half bank per pump without skipping a pump in the pump sequence. In contrast, the memory device 100 can achieve a 21 ms refresh rate by skipping the last pump in each pump group 661-664 of the corresponding pump sequence. To achieve a 25 ms refresh rate, the memory device 100 can skip the second and fourth pump in pump group 662 and 664 of the corresponding pump sequence. In the table 660 and 670 illustrated in FIGS. 6A and 6B, "Skip" and "Skp" refer to not activating any word lines in the corresponding pump, similar to the embodiment illustrated by pump group 552 in FIG. 5. In other embodiments, "Skip" and/or "Skp" can refer to immediately advancing and executing a next pump in the pump sequence, thereby reducing the overall number of executed pumps in the pump sequence by one for each "Skip" and/or "Skp."

After the memory device 100 fires the last pump of the last pump group in a pump sequence, the memory device 100 can return to fire the first pump in the first pump group in the pump sequence. In other words, each of the illustrated pump sequences are continuous loops. In some embodiments, the refresh state machine of the memory device 100 can track a last fired and/or a next-to-be-fired pump in a pump sequence (e.g., using the tables 660 and/or 670). Thus, the memory device 100 can be configured to pick up a pump sequence from any point at which the pump sequence is interrupted (e.g., by a self-refresh abort operation, a row hammer refresh steal operation, etc.). For example, if the 21 ms pump sequence in the section 667 of the table 660 is interrupted after firing pump 3 in the pump group 661, the refresh state machine can direct the memory device 100 to execute a skip as the first pump in the first pump group of the pump sequence when the memory device 100 resumes the refresh operation. In this example, the skipped pump (i.e., what used to be pump 4 in the pump group 1) now becomes pump 1 of pump group 1 of the pump sequence. Accordingly, each of the other pumps shift locations (i.e., three slots to the left) in the pump sequence. Thus, the memory device 100 now executes a skip as the first pump in each pump group of the pump sequence and fires the last three pumps in each pump group (e.g., until the refresh operation is interrupted again). In other words, the location of skips within a pump group and/or sequence can vary. In other embodiments, the locations of the skips within the pump sequence remain unchanged such that the memory device 100 always begins with the first pump in the pump sequence when the memory device 100 resumes a refresh operation. In these and other embodiments, the location(s) of the skip(s) in any of the illustrated pump sequences can be different than shown so long as the same total number of activated word lines in the pump sequences remains unchanged. For example, every pump in the first pump group of the 21 ms pump sequence can be skipped such that the memory device 100 fires every pump in the last three pump groups of the sequence to achieve the 21 ms refresh rate.

In some embodiments, the memory device 100 can toggle between 1×, 2×, and 4× mode. In these embodiments, the refresh state machine can direct the memory device 100 to pick up where it left off in a pump sequence in one operation mode (e.g., 1× mode) after it toggles to another operation mode (e.g., 2× mode) because the pump sequences in each of the sections 667-669 of the table 660 (i.e., for each operation mode 1×, 2×, and 4×) are identical. The only difference between the sections 667-669 of the table 660 is the number of pumps fired in response to each received refresh command.

Referring to the table 670 illustrated in FIG. 6B, the table includes section 677-679 each having pump groups 671-674 similar to the sections 667-669 and the pump groups 661-664, respectively, of the table 660 in FIG. 6A. The pumps 671-674 differ from the pumps 661-664, however, in that twice as many word lines are activated in parallel per memory bank 255 per pump because an additional address bit is compressed, as discussed above with respect to FIGS. 4A and 4B. Furthermore, the section 679 of the table 670 differs from other sections 667-669, 677, and 678 of the tables 660 and 670 in that the memory device 100 is configured to activate word lines in only half of the memory array 150 (e.g., half A or half B) per pump when operating in 4× mode because of the size (i.e., 8 GB) of the memory array 150. More specifically and in contrast with the 1× mode discussed above with respect to FIGS. 4A and 4B, the memory device 100 operating in 4× mode is configured to fire two pumps for each state of a single address bit. For example, in the 16 ms refresh rate pump sequence in the section 679 of the table 670, the memory device 100 can be configured (i) to activate 16 word lines in parallel per memory bank in half A of the memory array 150 in a first pump of state "0" of the address bit 11 and (ii) to activate 16 word lines in parallel per memory bank in the other half B of the array 150 in a second pump of the state "0" of the address bit 11. Similarly, the memory device 100 can be configured (i) to activate 16 word lines in parallel per memory bank in the half A of the memory array 150 in a first pump of state "1" of the address bit 11 and (ii) to activate 16 word lines in parallel per memory bank the half B of the array 150 in a second pump of the state "1" of the address bit 11.

As shown in FIG. 6B, the pump sequences illustrated in the table 670 are otherwise identical to the pump sequences illustrated in the table 660 illustrated in FIG. 6A. Thus, the memory device 100 in some embodiments can toggle between a four-pump option (FIG. 6A) and a two-pump option (FIG. 6B) (e.g., using the refresh state machine to (i) track where the memory device 100 finished in a pump sequence and (ii) indicate where the memory device 100 begins in a corresponding pump sequence).

Figure 7:
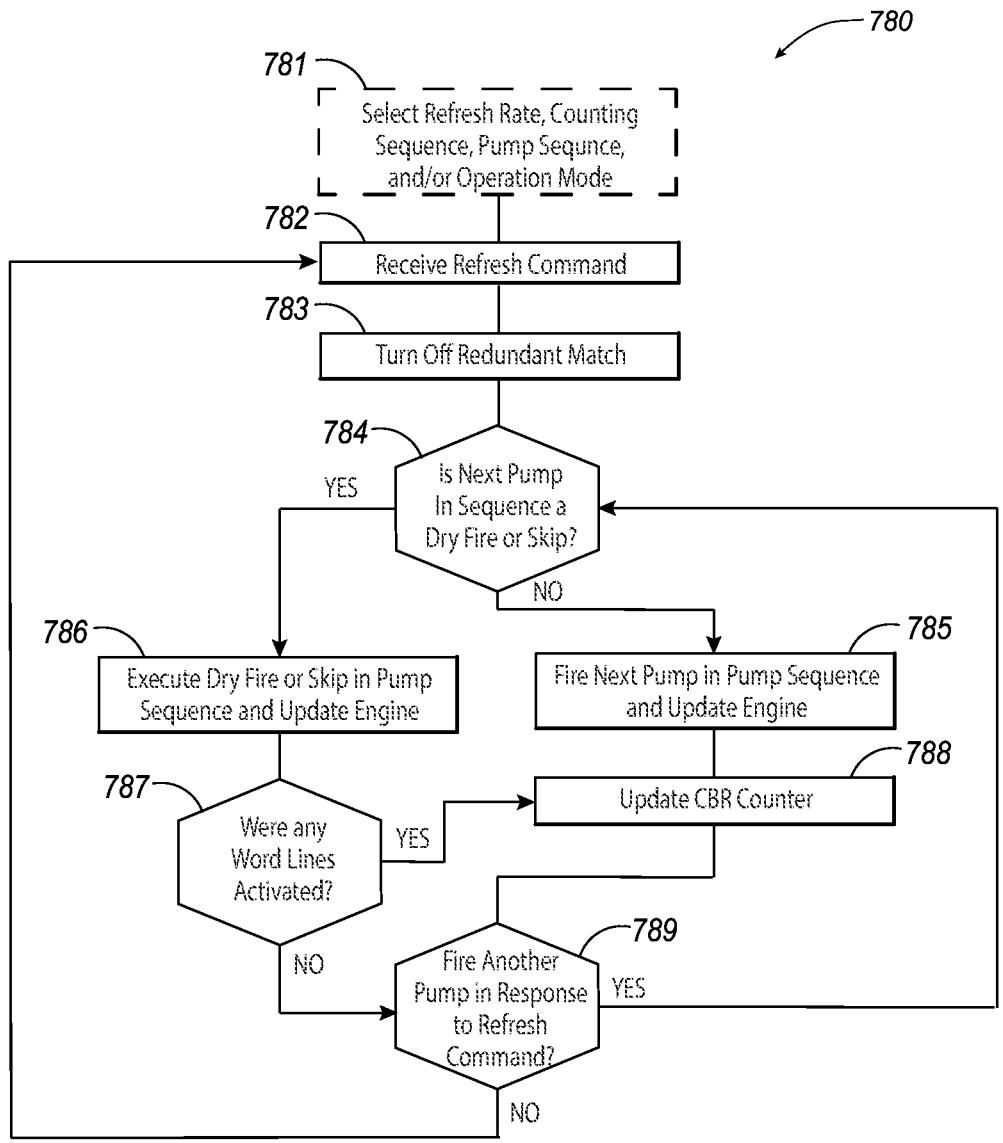
FIG. 7 is a flow diagram illustrating a routine for refreshing a memory array of a memory device configured in accordance with embodiments of the present technology.

FIG. 7 is a flow diagram illustrating a routine 780 for refreshing a memory array of a memory device (e.g., the memory device 100) configured in accordance with embodiments of the present technology. In some embodiments, the routine 780 can be executed, at least in part, by the memory device. For example, the routine 780 can be carried out by a row decoder, a redundancy match circuit, a CBR counter, a memory array, a memory bank, and/or an engine (e.g, a refresh state machine) of the memory device. In these and other embodiments, all or a subset of the steps of the routine 780 can be performed by other components of the memory device 100 (e.g., a command decoder), by a memory controller, by a host device, and/or by other components of a memory system.

The routine 780 can begin at block 781 to select a refresh rate, a counting sequence, a pump sequence, and/or an operation mode (e.g., in response to receiving a command to refresh memory cells in the memory array). In some embodiments, the routine 780 can blow one or more fuses in the memory array to select a refresh rate. For example, the routine 780 can blow one or more fuses during manufacturing and/or testing of the memory device, and/or the routine 780 can blow one or more fuses in an end user memory device. In other embodiments, the routine 780 can hardwire the memory array during manufacturing of the memory device to select a refresh rate.

The routine 780 can select a counting sequence to determine how many word lines are activated per memory bank per pump and to select a pump option (e.g., four-pump or two-pump). For example, the routine 780 can select how many address bits to compress in the CBR counter of the memory device to select how many word lines are activated per memory bank per pump. In these and other embodiments, the routine 780 can select how many address bits to pump in the CBR counter to select a number of state combinations on which to fire pumps or word lines. In these and still other embodiments, the routine 780 can change and/or alter the counting sequence (e.g., in the same or a future iteration of the routine 780).

The routine 780 can select a pump sequence in accordance with the selected refresh rate and/or the selected counting sequence. In some embodiments, the routine 780 can select a pump sequence from one or more stored tables (e.g., on the memory device). In other embodiments, the routine 780 can determine the number of dry fires or skips required to adhere to the selected refresh rate and/or can determine locations of the skips within pump groups of a pump sequence. In these and other embodiments, the routine 780 can determine the types of dry fires or skips implemented in the pump sequence. For example, the routine 780 can activate only a portion (e.g., a half) of the word lines in a pump to execute a dry fire or skip, can activate only a portion (e.g., a half) of the memory banks in the memory array to execute a dry fire or skip, and/or can activate none of the word lines in a pump to execute a dry fire or skip. In some embodiments, the routine 780 can later change and/or alter the location and/or type of one or more skips in the pump sequence (e.g., in the same or a future iteration of the routine 780).

In some embodiments, the routine 780 can select an operation mode such that the routine 780 fires a selected number of pumps in response to receiving a command to refresh memory cells in the memory array. For example, the routine 780 can select a 1× operation mode to fire four pumps in response to each refresh command received. In other embodiments, the routine 780 can select a 2× operation mode or a 4× operation mode to fire two pumps or one pump, respectively, in response to each refresh command received. In still other embodiments, the routine 780 can select another operation mode to fire a different number of pumps (e.g., five or more pumps, three or fewer pumps, a combination of five pumps and four pumps, etc.) in response to each refresh command received. In some embodiments, the routine 780 can later change and/or alter the number of pumps fired in response to each refresh command received.

In some embodiments, the routine 780 can alternatively begin at block 782. For example, the routine 780 can begin at block 782 if the routine 780 has selected a refresh rate, a counting sequence, a pump sequence, and/or an operation mode in a previous iteration of the routine 780. At block 782, the routine 780 can receive a refresh command. In some embodiments, the routine 780 can be configured to receive a refresh command from the host device or the memory controller.

At block 783, the routine 780 can disable redundancy match. For example, the routine 780 can disable redundancy match in the redundancy match circuit of the memory device (e.g., for the duration of the routine 780 and/or refresh operations). In some embodiments, the routine 780 can disable redundancy match in response to the refresh command received at block 782. In other embodiments, the routine 780 can automatically disable redundancy match in accordance with a predetermined cadence corresponding to a refresh operation of the memory device (e.g., every 7.8 μs in accordance with a minimum frequency of refresh operations).

At block 784, the routine 780 determines whether the next pump in the pump sequence is a dry fire or skip. If the next pump in the pump sequence is not a dry fire or skip, the routine 780 can proceed to block 785. At block 785, the routine 780 fires the next pump in the pump sequence. In some embodiments, the routine 780 tracks word lines in the next pump using a CBR counter of the memory device. The CBR counter can indicate the last activated word line address(es), or the CBR counter can indicate the next-to-be activated word line address(es). In a first iteration of the routine 780, the routine 780 can activate word lines starting at the beginning of the memory array (e.g., when the CBR counter is in an all "0" state). In some embodiments, the main word lines can be addressed at the beginning of the memory array such that the routine 780 activates main word lines in a main array of the memory array before activating redundant word lines in a redundant array of the memory array. In other embodiments, all or a portion of the redundant word lines can be addressed at and/or near the beginning of the memory array such that the routine 780 can activate redundant word lines before and/or after activating main word lines in the memory array. In these and still other embodiments, the routine 780 can activate word lines at an intermediate point in the memory array. For example, the routine 780 can track the last fired pump and/or the next-to-be fired pump in the pump sequence using an engine (e.g., a refresh state machine) of the memory device (e.g., to anticipate the routine 780 being interrupted by other operations of the memory device). In any given iteration of the routine 780, the routine 780 can fire the next-to-be fired pump in the pump sequence indicated by the engine, which in turn activates the next-to-be activated word lines (e.g., indicated by the CBR counter). After the routine 780 fires the pump, the routine 780 (1) can update the engine to indicate the last fired pump in the pump sequence or to indicate the next-to-be fired pump in the pump sequence and/or (2) can proceed to block 788 to update the CBR counter.

Returning again to block 784, if the next pump in the pump sequence is a dry fire or skip, the routine 780 can proceed to block 786 to execute the dry fire or skip. In some embodiments, the routine 780 can execute a dry fire or skip by firing a portion of a full set of word lines. In these and other embodiments, the routine 780 can execute a dry fire or skip by firing a portion of the memory array. In these and still other embodiments, the routine 780 can execute a dry fire or skip by remaining idle for at least a portion of the duration of the pump. After the routine 780 executes the dry fire or skip, the routine 780 can update the engine to indicate the last pump or the next-to-be fired pump in the pump sequence.

At block 787, the routine 780 determines whether the routine 780 activated word lines in the memory array (e.g., whether the routine 780 fired a portion of a full set of word lines and/or a portion of the memory array) at block 786. If the routine 780 determines that the routine 780 activated word lines at block 786, the routine 780 can proceed to block 788 to update the CBR counter to reflect the activated word lines. On the other hand, if the routine 780 determines that the routine 780 did not activate word lines at block 786, the routine 780 can proceed to block 789 to determine whether to fire a next pump in the pump sequence in response to the refresh command received at block 782.

At block 788, the routine 780 can update the CBR counter. In some embodiments, the routine 780 updates the CBR counter by incrementing address bits in the CBR counter to indicate the last activated word line(s) or to indicate the next-to-be activated word line(s). If incrementing the CBR counter changes a state of a RPTRow address bit in the counter to move from the main array to the redundancy array, the routine 780 can disable the row address decoder to the main array of word lines in the memory array 150 such that the routine 780 can access and activate redundant word lines in the redundancy array. On the other hand, if incrementing the CBR counter changes a state of the RPTRow address bit in the counter to move from the main array to the redundancy array, the routine 780 can enable the row address decoder to the main array of word lines in the memory array 150 such that the routine 780 can access and activate main word lines in the main array. If incrementing the CBR counter increments the counter beyond the last addressed word line in the memory array (e.g., in the redundancy array), the routine 780 can reset the CBR counter (e.g., to the all "0" state).

At block 789, the routine 780 determines whether to fire the next pump in the pump sequence in response to the refresh command received at block 782. For example and as discussed above, when the routine 780 is operating in 1× and 2× mode, the routine 780 can fire multiple pumps (e.g., four pumps or two pumps, respectively) in the pump sequence in response to a single refresh command. In these embodiments, if the routine 780 has executed and/or fired less than a full amount of pumps in response to the refresh command received at block 782, the routine 780 can return to block 784 to determine whether the next pump in the pump sequence is a dry fire or skip and/or to execute and/or fire the next pump in the pump sequence (blocks 785 and/or 786). On the other hand, if the routine 780 is operating in 4× mode and/or has executed and/or fired the full amount of pumps in response to the refresh command received at block 782, the routine 780 can return to block 782 to await the next refresh command.

The blocks 782-789 can be repeated until all memory cells in the memory array are refreshed and/or until the routine 780 is interrupted and/or aborted. In some embodiments, the routine 780 activates all word lines (main and/or redundant) in the memory array regardless of whether a word line has been repaired, has otherwise been flagged as defective, and/or has been used. In other embodiments, the routine 780 activates only word line that have not been repaired, have not otherwise been flagged as defective, and/or have been used.

Although the steps of the routine 780 are discussed and illustrated in a particular order, the method illustrated by the routine 780 in FIG. 7 is not so limited. In other embodiments, the method can be performed in a different order. In these and other embodiments, any of the steps of the routine 780 can be performed before, during, and/or after any of the other steps of the routine 780. Moreover, a person of ordinary skill in the relevant art will readily recognize that the illustrated method can be altered and still remain within these and other embodiments of the present technology. For example, one or more steps of the routine 780 illustrated in FIG. 7 can be omitted and/or repeated in some embodiments.

Figure 8:
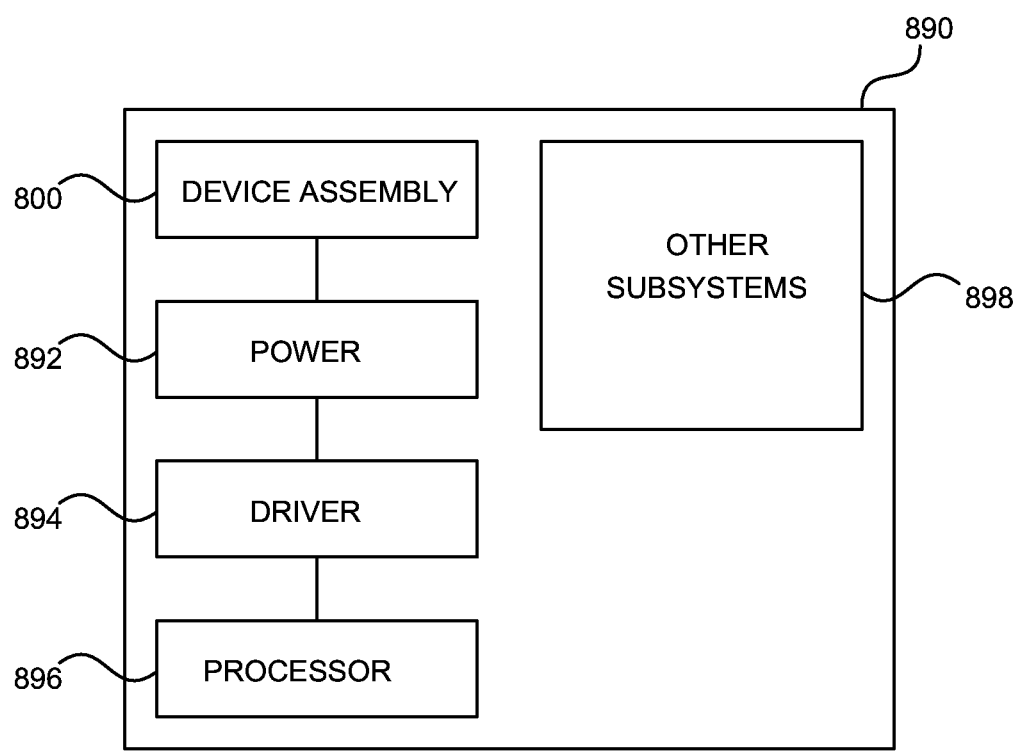
FIG. 8 is a schematic view of a system that includes a memory device configured in accordance with embodiments of the present technology.

FIG. 8 is a schematic view of a system that includes a memory device in accordance with embodiments of the present technology. Any one of the foregoing memory devices described above with reference to FIGS. 1-7 can be incorporated into any of a myriad of larger and/or more complex systems, a representative example of which is system 890 shown schematically in FIG. 8. The system 890 can include a semiconductor device assembly 800, a power source 892, a driver 894, a processor 896, and/or other subsystems and components 898. The semiconductor device assembly 800 can include features generally similar to those of the memory device described above with reference to FIGS. 1-7, and can, therefore, include various features of memory content authentication. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, vehicles, appliances, and other products. Components of the system 890 may be housed in a single unit or distributed over multiple, interconnected units (e.g., through a communications network). The components of the system 890 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device, comprising:
a memory array including a plurality of word lines arranged in a plurality of memory banks, wherein the plurality of word lines include main word lines and redundant word lines; and
circuitry configured to:
store a pump value indicating a current pump in a pump sequence,
store a multi-bit value indicating one or more addresses corresponding to one or more word lines in the plurality of word lines,
compress at least one bit of the multi-bit value such that the compressed multi-bit value simultaneously indicates more than one address corresponding to more than one word line in the plurality of word lines,
disable redundancy match,
activate the main word lines separate from the redundant word lines by firing a first pump in accordance with the pump sequence to activate, in parallel, the more than one word line corresponding to the more than one address simultaneously indicated by the compressed, multi-bit value to refresh data stored in the memory array, and
update the multi-bit value based at least in part on activating the more than one word line.

2. The memory device of claim 1, wherein the circuitry is further configured to—
compress the at least one bit in the multi-bit value such that the compressed multi-bit value simultaneously indicates two or more addresses corresponding to two or more word lines per memory bank in the plurality of memory banks; and
fire the first pump to activate the two or more word lines per memory bank in parallel.

3. The memory device of claim 1, wherein the most significant bit in the multi-bit value is a redundancy pretest bit.

4. The memory device of claim 1 further comprising a row address decoder, and wherein the circuitry is further configured to disable the row address decoder to activate the redundant word lines in the plurality of word lines separate from the main word lines in the plurality of word lines.

5. The memory device of claim 4, wherein the circuitry is further configured to activate the redundant word lines after activating the main word lines.

6. The memory device of claim 1, wherein the updated multi-bit value indicates one or more addresses corresponding to one or more second word lines in the plurality of word lines.

7. The memory device of claim 1, wherein the circuitry is further configured to update the pump value to indicate a next pump in the pump sequence as the current pump after firing the first pump.

8. The memory device of claim 7, wherein the next pump is a dry fire in the pump sequence, and wherein the circuitry is configured to remain idle for a duration of the next pump when the circuitry fires the next pump.

9. The memory device of claim 7, wherein—
the updated, multi-bit value indicates one or more addresses corresponding to one or more second word lines in the plurality of word lines;
the next pump is a dry fire in the pump sequence;
the circuitry is further configured to compress at least one bit of the updated multi-bit value such that the compressed, updated multi-bit value simultaneously indicates several addresses corresponding to several word lines in the plurality of word lines;
when firing the next pump, the circuitry is configured to activate a subset of the several word lines in parallel, wherein the subset of the several word lines corresponds to a subset of the several addresses simultaneously indicated by the compressed, updated multi-bit value;
the subset of the several addresses corresponds to a first number of word lines per memory bank in the plurality of memory banks and/or to one or more word lines on a second number of memory banks in the plurality of memory banks; and
the several addresses simultaneously indicated by the compressed, updated multi-bit value correspond to a third number of word lines per memory bank in the plurality of memory banks greater than the first number and/or to one or more word lines on a fourth number of memory banks in the plurality of memory banks greater than the second number.

10. The memory device of claim 1, wherein the circuitry is further configured to reset the multi-bit value to indicate one or more addresses corresponding to one or more word lines in the plurality of word lines at a beginning of the memory array after the circuitry updates the multi-bit value to indicate one or more addresses corresponding to one or more word lines in the plurality of word lines at an end of the memory array.

11. A method for refreshing data stored in a memory array of a memory device, the method comprising:
storing a second value indicating a current pump in a pump sequence;
storing a multi-bit value indicating one or more addresses corresponding to one or more word lines in a plurality of word lines of the memory array;
compressing at least one bit of the multi-bit value such that the compressed, multi-bit value simultaneously indicates more than one address corresponding to more than one word line in the plurality of word lines;
disabling redundancy match;
activating main word lines in the plurality of word lines separate from redundant word lines in the plurality of word lines by firing a first pump in accordance with the pump sequence to activate the more than one word line corresponding to the more than one address simultaneously indicated by the compressed, multi-bit value, wherein the more than one word line is activated to refresh data stored in the memory array; and
updating the multi-bit value based at least in part on activating the more than one word line.

12. The method of claim 11, wherein the pump sequence (i) corresponds to a refresh rate of the memory device and (ii) includes more than one pump.

13. The method of claim 11, further comprising updating, based at least in part on firing the first pump, the second value to indicate a second pump in the pump sequence as the current pump.

14. The method of claim 13, further comprising firing the second pump in the pump sequence corresponding to the current pump indicated by the second value, wherein the second pump in the pump sequence is a dry fire, and wherein firing the second pump includes remaining idle for a duration of the second pump.

15. The method of claim 13, wherein:
the updated, multi-bit value indicates one or more addresses corresponding to one or more second word lines in the plurality of word lines;
the second pump in the pump sequence is a dry fire; and
the method further comprises:
compressing at least one bit of the updated multi-bit value such that the compressed, updated multi-bit value simultaneously indicates several addresses corresponding to several word lines in the plurality of word lines, and
firing the second pump in the pump sequence corresponding to the current pump indicated by the second value, wherein firing the second pump includes activating, in parallel, a subset of the several word lines, and wherein the subset of the several word lines corresponds to a subset of the several addresses simultaneously indicated by the compressed, updated multi-bit value.

16. The method of claim 15, further comprising (i) updating the second value based at least in part on firing the second pump and (ii) firing a third pump in the pump sequence corresponding to the current pump indicated by the second value, wherein—
the plurality of word lines are arranged in a plurality of memory banks;
firing the second pump includes activating a first number of word lines in the plurality of word lines in parallel per memory bank; and
firing the third pump includes activating a second number of word lines in the plurality of word lines in parallel per memory bank greater than the first number.

17. The method of claim 15, further comprising (i) updating the second value based at least in part on firing the second pump and (ii) firing a third pump in the pump sequence corresponding to the current pump indicated by the second value, wherein—
the plurality of word lines are arranged in a plurality of memory banks;
firing the second pump includes activating word lines in parallel on a first number of memory banks in the plurality of memory banks; and
firing the third pump includes activating word lines in parallel on a second number of memory banks in the plurality of memory banks greater than the first number.

18. The method of claim 11, further comprising:
receiving a first refresh command, and
in response to receiving the first refresh command, firing the first pump in the pump sequence corresponding to the current pump indicated by the second value, updating the second value based at least in part on firing the first pump, and firing a second pump in the pump sequence indicated by the updated second value.

19. A method for refreshing data stored in a memory device, the method comprising:
   storing a value indicating a current pump in a pump sequence;
   storing a multi-bit value indicating one or more addresses corresponding to one or more word lines in a plurality of word lines of the memory device, wherein the plurality of word lines are arranged in a plurality of memory banks in a memory array of the memory device;
   compressing at least one bit of the multi-bit value such that the multi-bit value simultaneously indicates more than one address corresponding to more than one word line of the plurality of word lines;
   disabling redundancy match;
   activating main word lines in the plurality of word lines separate from redundant word lines in the plurality of word lines by firing a first pump in accordance with the pump sequence to activate, in parallel, the more than one word line corresponding to the more than one address simultaneously indicated by the compressed, multi-bit value, wherein the more than one word line is activated to refresh data stored in the memory device; and
   updating the multi-bit value based at least in part on activating the more than one word line.

20. The method of claim 19, wherein updating the multi-bit value includes changing a state of a bit of the multi-bit value.

21. The method of claim 20, wherein—
   the main word lines are arranged in a main array and the redundant word lines are arranged in a redundant array;
   at least one word line corresponding to the one or more addresses indicated by the multi-bit value is located at an end of the main array; and
   updating the multi-bit value includes changing the state of the bit from a first state to a second state; and
   the method further comprises:
      disabling a row address decoder of the memory device in response to changing the state of the bit from the first state to the second state, and
      activating, by firing a second pump, a word line in the redundant array corresponding to at least one address indicated by the updated value.

22. The method of claim 20, wherein—
   the main word lines are arranged in a main array and the redundant word lines are arranged in a redundant array;
   at least one word line corresponding to the one or more addresses indicated by the multi-bit value is located at an end of the redundant array;
   updating the multi-bit value includes (i) resetting the multi-bit value and (ii) changing the state of the bit from a second state to a first state; and
   the method further comprises:
      enabling a row address decoder of the memory device in response to changing the state of the bit from the second state to the first state; and
      activating, by firing a second pump, a word line in the main array corresponding to at least one addresses indicated by the reset value.

23. The method of claim 19, wherein compressing the at least one bit of the multi-bit value includes compressing the at least one bit such that the multi-bit value simultaneously indicates two or more addresses corresponding to two or more word lines in the plurality of word lines per memory bank in the plurality of memory banks.

24. The method of claim 20 further comprising pumping the bit of the multi-bit value, wherein the pumping includes firing the first pump when the bit of the multi-bit value is in a first state and firing a second pump when the bit of the value is in a second state.

25. The method of claim 19, wherein the method further comprises repairing a defective one of the main word lines with a single one of the redundant word lines.

* * * * *